United States Patent
Pal et al.

(10) Patent No.: US 8,148,750 B2
(45) Date of Patent: *Apr. 3, 2012

(54) TRANSISTOR DEVICE HAVING ASYMMETRIC EMBEDDED STRAIN ELEMENTS AND RELATED MANUFACTURING METHOD

(75) Inventors: Rohit Pal, Fishkill, NY (US); Frank Bin Yang, Mahwah, NJ (US); Michael J. Hargrove, Clinton Corners, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/052,969

(22) Filed: Mar. 21, 2011

(65) Prior Publication Data

US 2011/0169073 A1 Jul. 14, 2011

Related U.S. Application Data

(63) Continuation of application No. 12/176,835, filed on Jul. 21, 2008, now Pat. No. 7,939,852.

(51) Int. Cl.
*H01L 21/02* (2006.01)

(52) U.S. Cl. .......... 257/190; 257/194; 257/18; 257/255; 257/288; 257/E29.268; 257/E29.246; 257/E21.403; 438/285; 438/286

(58) Field of Classification Search .................. 257/190, 257/194, 18, 255, 288, E29.268, E29.246, 257/E21.403; 438/285, 286
See application file for complete search history.

(56) References Cited

U.S. PATENT DOCUMENTS

| 5,036,017 | A | 7/1991 | Noda | |
|---|---|---|---|---|
| 7,939,852 | B2* | 5/2011 | Pal et al. | 257/190 |
| 2007/0253239 | A1 | 11/2007 | Wang et al. | |
| 2008/0233691 | A1* | 9/2008 | Cheng et al. | 438/197 |
| 2009/0032845 | A1* | 2/2009 | Zhu et al. | 257/192 |
| 2009/0124056 | A1 | 5/2009 | Chen et al. | |
| 2009/0263949 | A1 | 10/2009 | Anderson et al. | |

* cited by examiner

*Primary Examiner* — Tu-Tu Ho
(74) *Attorney, Agent, or Firm* — Ingrassia Fisher & Lorenz, P.C.

(57) ABSTRACT

Semiconductor transistor devices and related fabrication methods are provided. An exemplary transistor device includes a layer of semiconductor material having a channel region defined therein and a gate structure overlying the channel region. Recesses are formed in the layer of semiconductor material adjacent to the channel region, such that the recesses extend asymmetrically toward the channel region. The transistor device also includes stress-inducing semiconductor material formed in the recesses. The asymmetric profile of the stress-inducing semiconductor material enhances carrier mobility in a manner that does not exacerbate the short channel effect.

9 Claims, 6 Drawing Sheets

TRANSISTOR DEVICE HAVING ASYMMETRIC EMBEDDED STRAIN ELEMENTS AND RELATED MANUFACTURING METHOD

CROSS-REFERENCE TO RELATED APPLICATION

This application is a continuation of U.S. patent application Ser. No. 12/176,835, filed Jul. 21, 2008.

TECHNICAL FIELD

Embodiments of the subject matter described herein relate generally to semiconductor devices. More particularly, embodiments of the subject matter relate to fabrication of semiconductor transistors having embedded strain elements.

BACKGROUND

The prior art is replete with different techniques and processes for fabricating semiconductor devices such as metal oxide semiconductor (MOS) transistors. In accordance with typical fabrication techniques, a MOS transistor is formed by creating a device structure on a semiconductor substrate, where the device structure includes a gate stack formed on a layer of semiconductor material, and source and drain regions formed in the semiconductor material to define a channel region under the gate stack. In addition, embedded strain elements (i.e., doped/undoped semiconductor material that strains the channel region) can be used to improve the performance of MOS transistors. In this regard, FIG. 1 is a cross sectional view of a MOS transistor device structure 100 having such embedded strain elements 102 located within a layer of semiconductor material 104. FIG. 1 depicts MOS transistor device structure 100 at an intermediate stage in the overall fabrication process.

For maximum channel stress, it is desirable to locate the embedded strain elements as close to the edge of the gate region as possible. However, the minimum distance between doped embedded strain elements in the semiconductor material (near the channel region) is limited due to the out-diffusion of the doped species into the channel region. Such out-diffusion exacerbates the short channel effect (SCE) that occurs in MOS transistors fabricated using modern small scale process nodes, for example, 45 nm nodes and beyond. To better control SCE, MOS transistor device structure 100 employs embedded strain elements 102 having a symmetric and stepped profile, as shown in FIG. 1. In this regard, embedded strain elements 102 are symmetric relative to the channel region. The stepped profile results in a relatively narrow separation between the upper portions 106 of embedded strain elements 102, and a relatively wide separation between the lower portions 108 of embedded strain elements 102. This structure facilitates the realization of shallow junctions for better SCE control.

BRIEF SUMMARY

A semiconductor transistor device is provided with asymmetric stress-inducing regions. The device includes a layer of semiconductor material having a channel region defined therein, and a gate structure overlying the channel region. The device also includes recesses formed in the layer of semiconductor material and adjacent to the channel region. The recesses extend asymmetrically toward the channel region. The device also includes stress-inducing semiconductor material formed in the recesses.

The above and other aspects may be found in an embodiment of a semiconductor transistor device having a layer of semiconductor material, a gate structure overlying the layer of semiconductor material, a source region in the layer of semiconductor material, and a drain region in the layer of semiconductor material. The gate structure has a source sidewall and a drain sidewall, the source region includes a stress-inducing semiconductor material, and the drain region also includes the stress-inducing semiconductor material. The minimum distance between the stress-inducing semiconductor material of the source region and a projection of the source sidewall into the layer of semiconductor material is less than the minimum distance between the stress-inducing semiconductor material of the drain region and a projection of the drain sidewall into the layer of semiconductor material.

A method of fabricating a semiconductor transistor device is also provided. The method forms a gate structure overlying a channel region of a layer of semiconductor material, and forms a source-side spacer and a drain-side spacer adjacent sidewalls of the gate structure. The method also involves the implanting of ions of an amorphizing species at a tilted angle toward the source-side spacer and into the semiconductor material, using the gate structure and the spacers as an implantation mask to shadow the semiconductor material proximate the drain-side spacer, to form asymmetric amorphized regions in the semiconductor material. Thereafter, the method selectively removes the asymmetric amorphized regions, resulting in corresponding recesses in the semiconductor material, the recesses extending asymmetrically toward the channel region, and at least partially fills the recesses with stress-inducing semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
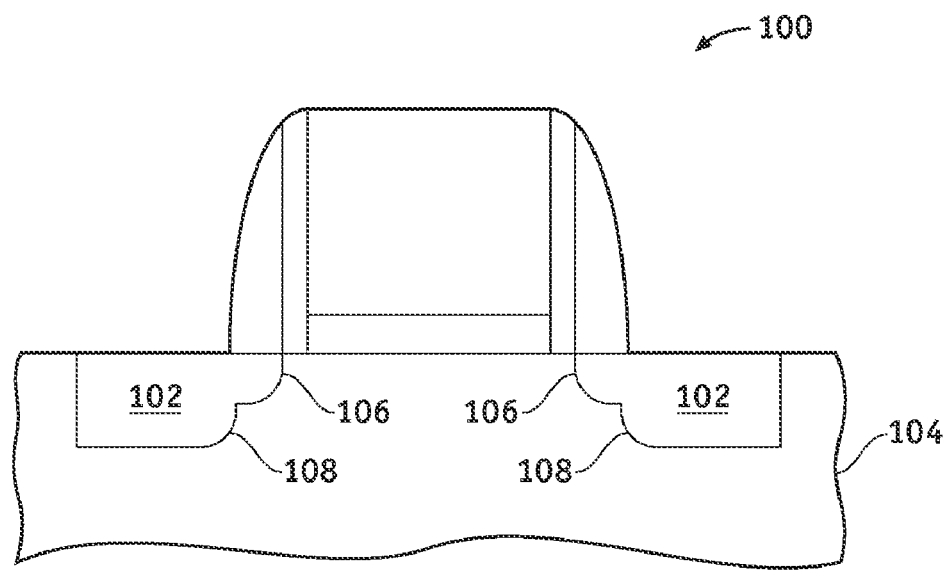
FIG. 1 is a cross sectional view of a prior art MOS transistor device structure having embedded strain elements symmetrically located within a layer of semiconductor material.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The proximity of embedded stress-inducing regions for semiconductor transistor devices (such as in situ phosphorus-doped eSi:C in NMOS source/drain regions, or in situ Boron-doped eSiGe in PMOS source/drain regions) is limited by the diffusion length from the stress-inducing regions to the edge of the gate region. The diffusion length is determined by the type of species (e.g., phosphorus or boron), and the thermal treatment process (e.g., rapid thermal annealing). For maximum channel stress, it is desirable to locate the embedded stress-inducing regions as close to the gate region as possible. However, if the stress-inducing regions are too close to the gate edge, then the short channel effect (SCE) in the transistor device will be exacerbated, due to the deeper junctions related to the in situ phosphorus-doped eSi:C epitaxial source/drain or in situ boron-doped eSiGe epitaxial source/drain, resulting in performance degradation.

It has been discovered that the sensitivities of both the channel mobility and SCE to stressor proximity (i.e., proximity of the stress-inducing region to the gate region) are not equal on the source side and the drain side. It has been observed that the channel mobility is more sensitive to the proximity of the source side stressor than that to the drain side (closer source side proximity is preferred for high mobility), while the SCE is much more sensitive to the proximity of the stressor on the drain side than that to the source side (larger proximity to the drain side is required for better SCE). Therefore, it would be desirable to have a transistor device having a stress-inducing region on the source side that is relatively close to the gate region, compared to the stress-inducing region on the drain side. In other words, asymmetric stress-inducing regions, relative to their proximity to the gate region, is desirable to enhance device performance while reducing the SCE.

There are fundamental reasons why closer proximity to the source side is preferred than that to the drain side. First, from a channel mobility point of view, only the source side of mobility-enhancement contributes to the device performance gain, while the drain side mobility is essentially insensitive to the device performance. This is because, on the source side, the electric filed intensity is low and it takes higher carrier mobility to achieve the desired velocity (where velocity=mobility×field intensity), therefore, higher stress on the source side by closer proximity enhances device mobility and performance. However, on the drain side, since the field intensity has already exceeded velocity saturation, increasing stress on the drain side by closer proximity does not help device mobility and performance. Second, from an SCE point of view, only the drain side requires shallow junction (shallow junction is good for SCE), while the source side prefers a deeper junction to reduce source resistance and hence higher drive current. This is because only the drain side junction is reversely biased and a shallow drain side junction helps the gate to turn on the transistor off and on more efficiently (i.e., better SCE), while the source side of the junction is forward biased, it does not influence device short channel control.

Figure 3:
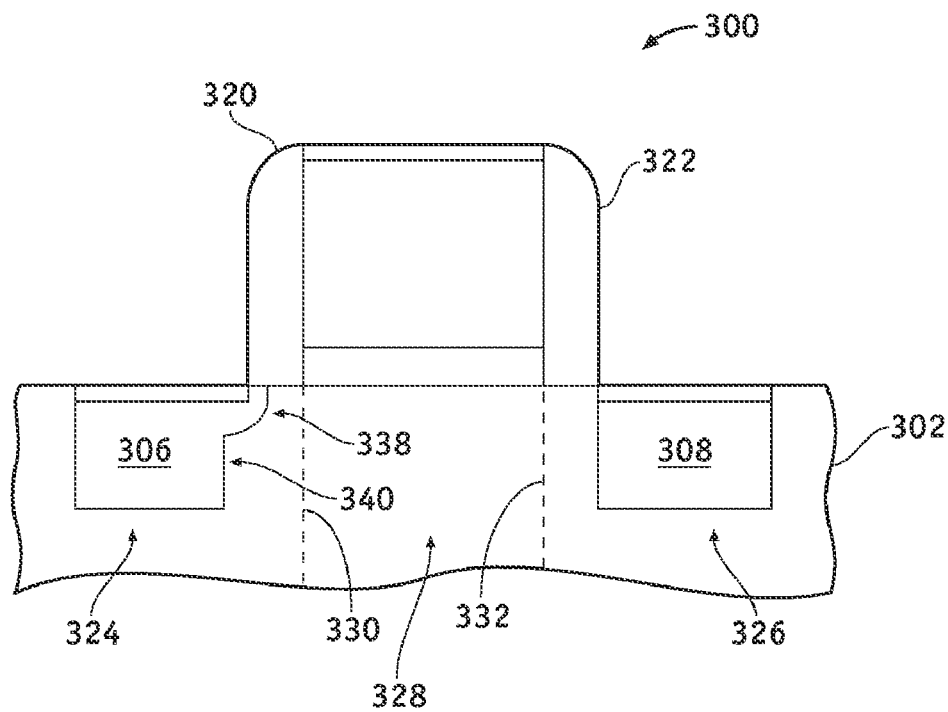
FIG. 3 is a cross sectional view of a MOS transistor device structure configured in accordance with a second exemplary embodiment.
Figure 4:
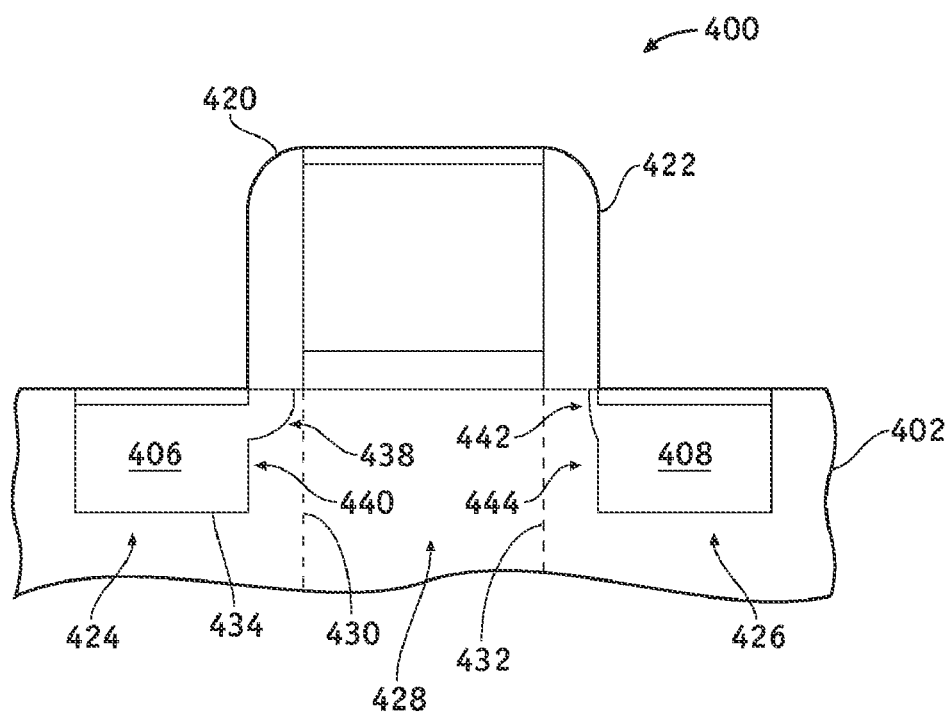
FIG. 4 is a cross sectional view of a MOS transistor device structure configured in accordance with a third exemplary embodiment.

The semiconductor transistor devices described herein employ a structure having asymmetric recesses with embedded strain elements flanking the gate region. The semiconductor device manufacturing process described herein is suitable for use with 45 nm node technology, 32 nm node technology, and beyond, however, the use of such node technologies is not a requirement. The manufacturing process creates asymmetric cavities having different profiles that extend toward the gate region, as generally depicted in FIGS. 2-4.

Figure 2:
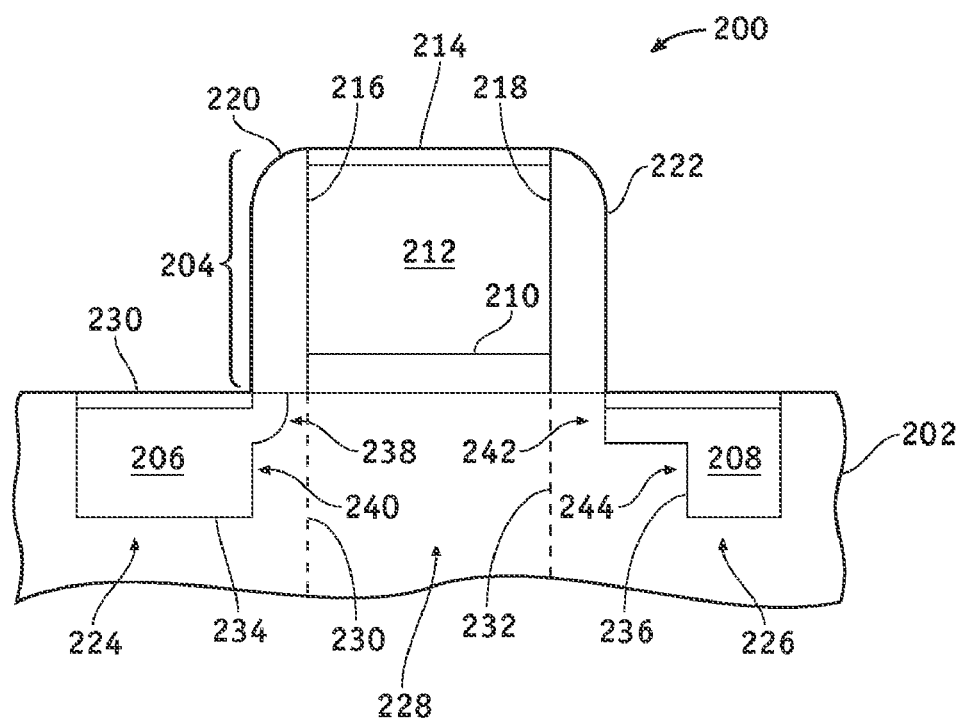
FIG. 2 is a cross sectional view of a MOS transistor device structure configured in accordance with a first exemplary embodiment.

FIG. 2 is a cross sectional view of a MOS transistor device structure 200 configured in accordance with a first exemplary embodiment. MOS transistor device structure 200 may ultimately take the form of an NMOS transistor device or a PMOS transistor device. The description of well known and conventional features and aspects of semiconductor transistor devices may be briefly summarized or omitted entirely without providing the well known details.

MOS transistor device structure 200 generally includes a layer of semiconductor material 202, a gate structure 204 overlying semiconductor material 202, and stress-inducing semiconductor material 206/208. The semiconductor material 202 is preferably a silicon material as typically used in the semiconductor industry, e.g., relatively pure silicon as well as silicon admixed with other elements such as germanium, carbon, and the like. Alternatively, semiconductor material 202 can be germanium, gallium arsenide, or the like. Semiconductor material 202 can be either N-type or P-type, but is typically P-type, with wells of the appropriate type formed therein. Moreover, semiconductor material 202 may be part of a bulk semiconductor wafer, or it may be realized as a thin layer of semiconductor material on an insulating substrate (commonly known as semiconductor-on-insulator or SOI) that, in turn, is supported by a carrier wafer.

Gate structure 204 may include a gate insulator 210, a gate electrode 212 overlying gate insulator 210, and a contact area 214. Gate insulator 210 can be formed from a layer of thermally grown silicon dioxide or a deposited insulator such as a silicon oxide, silicon nitride, or the like. Gate insulator 210 preferably has a thickness of about 1-10 nm, although the actual thickness can be determined based on the application of the transistor in the circuit being implemented. In accordance with one embodiment, gate electrode 212 is formed from doped polycrystalline silicon. Contact area 214 is preferably realized as a metal silicide area formed on gate electrode 212.

Gate structure 204 includes two sidewalls: a source sidewall 216 that is proximate the source side of MOS transistor device structure 200; and a drain sidewall 218 that is proximate the drain side of MOS transistor device structure 200. The illustrated embodiment of MOS transistor device structure 200 includes a spacer 220 on source sidewall 216 and a spacer 222 on drain sidewall 218. Spacers 220/222 are formed from a suitable dielectric material such as silicon oxide and/or silicon nitride, preferably silicon nitride.

MOS transistor device structure 200 includes a source region 224 and a drain region 226 in semiconductor material 202. Source region 224 includes or is defined by stress-inducing semiconductor material 206, and drain region 226 includes or is defined by stress-inducing semiconductor material 208. For ease of description, it is assumed that the stress-inducing semiconductor material 206 defines the boundary of source region 224, and that the stress-inducing semiconductor material 208 defines the boundary of drain region 226.

MOS transistor device structure 200 also includes a channel region 228 defined in semiconductor material 202. When biased properly, a conductive channel is formed in channel region 228 between source region 224 and drain region 226, as is understood by those familiar with semiconductor transistor operation. As shown in FIG. 2, gate structure 204 is aligned with channel region 228; gate structure 204 overlies channel region 228. Channel region 228 is generally flanked by source region 224 and drain region 226 and, consequently, by stress-inducing semiconductor material 206 and 208. For purposes of illustration and ease of description, FIG. 2 shows the projection 230 of source sidewall 216 into semiconductor material 202, and the projection 232 of drain sidewall 218 into semiconductor material 202. These imaginary projections 230/232 may be considered reference boundaries for channel region 228, although in reality channel region 228 need not defined as such.

During fabrication of MOS transistor device structure 200, recesses are formed in the layer of semiconductor material 202. These recesses (e.g., a source recess 234 and a drain recess 236) are positioned adjacent and proximate to channel region 228. After creation of the recesses, stress-inducing semiconductor material 206 is formed in source recess 234, and stress-inducing semiconductor material 208 is formed in drain recess 236. Accordingly, for purposes of this description, the boundaries of stress-inducing semiconductor material 206, source region 224, and source recess 234 correspond to one another, and the boundaries of stress-inducing semiconductor material 208, drain region 226, and drain recess 236 correspond to one another.

Notably, the recesses 234/236 (and stress-inducing semiconductor material 206/208 contained therein) extend asymmetrically toward channel region 228 relative to each other. In particular, source recess 234 (and, therefore, stress-inducing semiconductor material 206) extends further toward channel region 228 than drain recess 236 (and, therefore, stress-inducing semiconductor material 208). In other words, the minimum distance between stress-inducing semiconductor material 206 and projection 230 is less than the minimum distance between stress-inducing semiconductor material 208 and projection 232. This asymmetric positioning of the stress-inducing semiconductor material takes advantage of the relatively low SCE sensitivity on the source side of MOS transistor device structure 200, and the relatively high SCE sensitivity on the drain side of MOS transistor device structure 200.

For this particular embodiment of MOS transistor device structure 200, source recess 234 is shaped as a stepped recess having an upper portion 238 and a lower portion 240. Source recess 234 is formed such that its upper portion 238 extends further toward channel region 228 than its lower portion 240 (i.e., upper portion 238 is closer to projection 230 than lower portion 240). Again, because stress-inducing semiconductor material 206 follows the contour of source recess 234, the upper portion of stress-inducing semiconductor material 206 extends further toward projection 230 than the lower portion of stress-inducing semiconductor material 206.

Although not a requirement, drain recess 236 is also shaped as a stepped recess having an upper portion 242 and a lower portion 244. Drain recess 236 is formed such that its upper portion 242 extends further toward channel region 228 than its lower portion 244 (i.e., upper portion 242 is closer to projection 232 than lower portion 244). Again, because stress-inducing semiconductor material 208 follows the contour of drain recess 236, the upper portion of stress-inducing semiconductor material 208 extends further toward projection 232 than the lower portion of stress-inducing semiconductor material 208. Notably, the minimum distance between upper portion 238 (of source recess 234 and stress-inducing semiconductor material 206) and projection 230 is less than the minimum distance between upper portion 242 (of drain recess 236 and stress-inducing semiconductor material 208) and projection 232.

In preferred embodiments, the stress-inducing semiconductor material 206/208 is a doped silicon-based material, and stress-inducing semiconductor material 206/208 is formed by selectively epitaxially growing an in situ doped silicon material in recesses 234/236. As used here, "in situ doped" means that a suitable dopant is introduced into a host material as that host material is grown. Epitaxially grown in situ doped silicon material is utilized here such that the material need not be subjected to ion implantation for purposes of doping.

For an NMOS transistor device, the in situ doped semiconductor material is an N-type semiconductor material, such as in situ phosphorus doped silicon carbon, or other materials that have a smaller lattice constant than silicon, such as a compound semiconductor, or the like. This results in a tensile longitudinal stress applied to channel region 228 and increased electron mobility. In contrast, for a PMOS transistor device, the in situ doped semiconductor material is a P-type semiconductor material, such as in situ boron doped silicon germanium, or other materials that have a greater lattice constant than silicon, such as a compound semiconductor, or the like. This results in a compressive longitudinal stress applied to channel region 228 and increased hole mobility. When fabricating CMOS devices, the recesses of PMOS devices will be masked during the growth of the epitaxial material for NMOS devices, and vice versa. The asymmetric profile of stress-inducing semiconductor material 206 and 208 enables the transistor device to strike a good balance between increased carrier mobility and SCE. In other words, the asymmetric profile achieves increased carrier mobility without exacerbating the undesired SCE.

FIG. 3 is a cross sectional view of a MOS transistor device structure 300 configured in accordance with a second exemplary embodiment. MOS transistor device structure 300 shares many features and characteristics with MOS transistor device structure 200 and common features, characteristics, and aspects will not be redundantly described in detail here in the context of MOS transistor device structure 300.

MOS transistor device structure 300 generally includes a layer of semiconductor material 302, stress-inducing semiconductor material 306 for a source region 324, stress-inducing semiconductor material 308 for a drain region 326, and a channel region 328. Stress-inducing semiconductor material 306 includes an upper portion 338 and a lower portion 340;

upper portion 338 extends further toward channel region 328 than lower portion 340. Notably, stress-inducing semiconductor material 308 has a straight side profile that does not extend under spacer 322. MOS transistor device structure 300 depicts a state after temporary spacers (used to create the recesses) have been removed and replaced with spacers 320/322.

Stress-inducing semiconductor material 308 (on the drain side) has a relatively straight profile rather than a stepped profile. Nonetheless, the minimum distance between stress-inducing semiconductor material 306 and the projection 330 is still less than the minimum distance between stress-inducing semiconductor material 308 and the projection 332. Accordingly, the benefits described above for MOS transistor device structure 200 can also be obtained using MOS transistor device structure 300.

FIG. 4 is a cross sectional view of a MOS transistor device structure 400 configured in accordance with a third exemplary embodiment. MOS transistor device structure 400 shares many features and characteristics with MOS transistor device structure 200 and common features, characteristics, and aspects will not be redundantly described in detail here in the context of MOS transistor device structure 400.

MOS transistor device structure 400 generally includes a layer of semiconductor material 402, stress-inducing semiconductor material 406 for a source region 424, stress-inducing semiconductor material 408 for a drain region 426, and a channel region 428. Stress-inducing semiconductor material 406 includes an upper portion 438 and a lower portion 440; upper portion 438 extends further toward channel region 428 than lower portion 440. Similarly, stress-inducing semiconductor material 408 includes an upper portion 442 and a lower portion 444; upper portion 442 extends further toward channel region 428 than lower portion 444.

Notably, both upper portions 438/442 extend under their respective spacers 420/422 (in contrast, upper portion 242 of MOS transistor device structure 200 does not extend beneath spacer 222). Stress-inducing semiconductor material 406 has a stepped profile, as described above for MOS transistor device structure 200. Stress-inducing semiconductor material 408 has a similar stepped profile, however, its upper portion 442 does not extend toward channel region 428 as far as upper portion 438 of stress-inducing semiconductor material 406. In other words, the minimum distance between stress-inducing semiconductor material 406 and the projection 430 is still less than the minimum distance between stress-inducing semiconductor material 408 and the projection 432. Accordingly, the benefits described above for MOS transistor device structure 200 can also be obtained using MOS transistor device structure 400.

FIGS. 5-12 are cross sectional views that illustrate an exemplary MOS transistor device structure 500 and a method of fabricating it—MOS transistor device structure 500 may ultimately take the form of an NMOS transistor device or a PMOS transistor device. The illustrated process can be utilized to manufacture MOS transistor device structure 200 (see FIG. 2). The description of well known and conventional steps related to the fabrication of semiconductor devices may be briefly summarized or omitted entirely without providing the well known process details.

Figure 5:
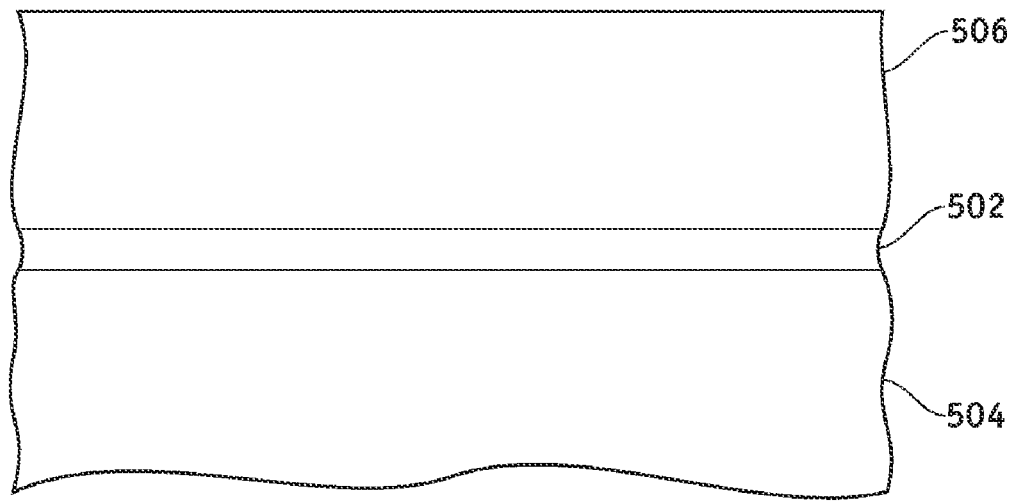
FIGS. 5-12 are cross sectional views that illustrate an exemplary MOS transistor device structure and methods of fabricating the MOS transistor device structure.

Referring to FIG. 5, the fabrication process begins by forming a gate insulator material 502 overlying a layer of semiconductor material 504. The semiconductor material 504 is preferably a silicon material as typically used in the semiconductor industry, e.g., relatively pure silicon as well as silicon admixed with other elements such as germanium, carbon, and the like. Alternatively, semiconductor material 504 can be germanium, gallium arsenide, or the like. Semiconductor material 504 can be either N-type or P-type, but is typically P-type. Moreover, semiconductor material 504 may be part of a bulk semiconductor wafer, or it may be realized as a thin layer of semiconductor material on an insulating substrate (commonly known as semiconductor-on-insulator or SOI) that, in turn, is supported by a carrier wafer.

Gate insulator material 502 can be a layer of thermally grown silicon dioxide or, alternatively (as illustrated), a deposited insulator such as a silicon oxide, silicon nitride, or the like. Deposited insulators can be deposited, for example, by chemical vapor deposition (CVD), low pressure chemical vapor deposition (LPCVD), or plasma enhanced chemical vapor deposition (PECVD). Gate insulator material 502 preferably has a thickness of about 1-10 nm, although the actual thickness can be determined based on the application of the transistor in the circuit being implemented.

A layer of gate electrode material 506 is formed overlying gate insulator material 502. In accordance with one embodiment, gate electrode material 506 is polycrystalline silicon. The layer of polycrystalline silicon is preferably deposited as undoped polycrystalline silicon and is subsequently impurity doped by ion implantation. The polycrystalline silicon can be deposited by LPCVD by the hydrogen reduction of silane. A layer of hard mask material (not shown), such as silicon nitride or silicon oxynitride, can be deposited onto the surface of the polycrystalline silicon. The hard mask material can be deposited to a thickness of about 50 nm, also by LPCVD.

Figure 6:
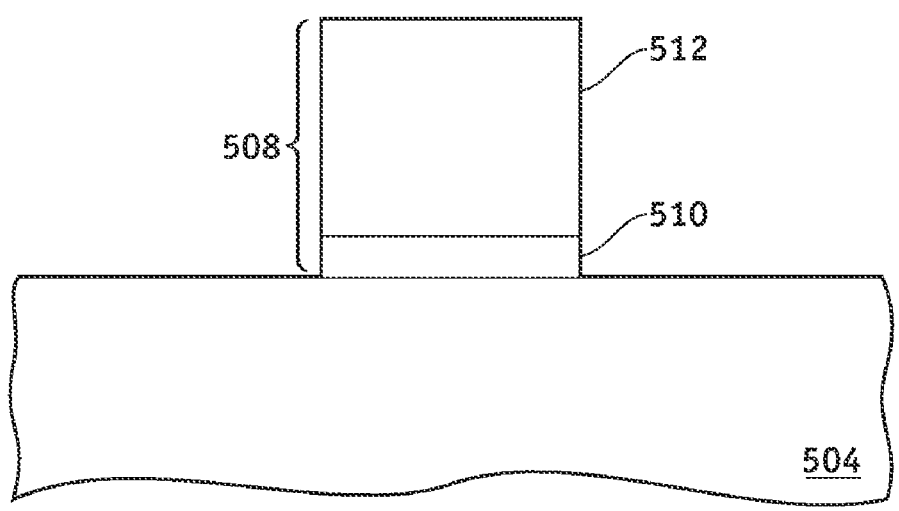

The hard mask layer is photolithographically patterned and the underlying gate electrode material 506 and gate insulator material 502 are etched to form a gate structure (also referred to as a gate stack) 508 having a gate insulator 510 and a gate electrode 512, as illustrated in FIG. 6. The polycrystalline silicon can be etched in the desired pattern by, for example, reactive ion etching (RIE) using a chlorine or $HBr/O_2$ chemistry and the hard mask and gate insulating material can be etched, for example, by RIE in a $CHF_3$, $CF_4$, or $SF_6$ chemistry.

Figure 7:
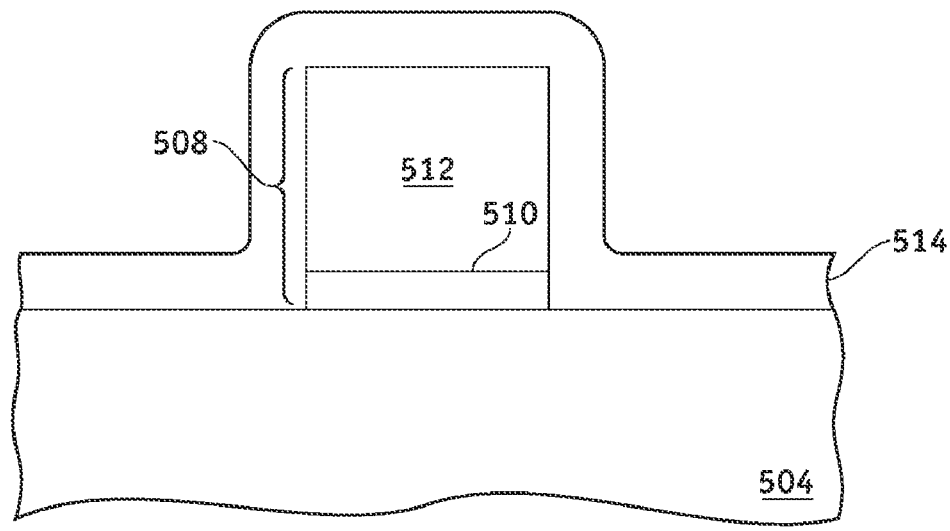

Referring to FIG. 7, a layer 514 of dielectric material is conformally deposited overlying gate structure 508. The dielectric material is an appropriate insulator, such as silicon oxide and/or silicon nitride, preferably silicon nitride. The dielectric material can be deposited in a known manner by, for example, atomic layer deposition (ALD), CVD, LPCVD, semi-atmospheric chemical vapor deposition (SACVD), or PECVD. Layer 514 is deposited to a thickness so that, after anisotropic etching, spacers formed from layer 514 have a thickness that is appropriate for the subsequent ion implantation and etching steps described below. In typical implementations, the layer 514 of dielectric material is deposited to a thickness of about 5-50 nm.

Figure 8:
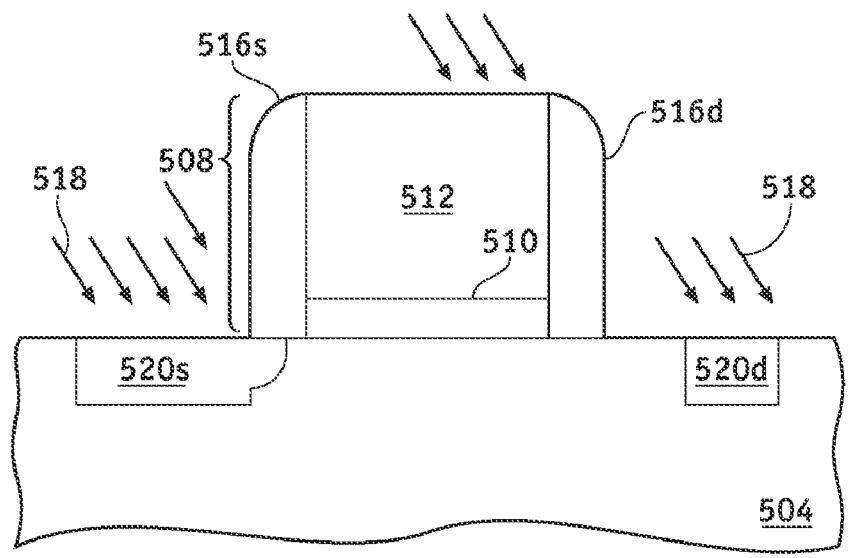

The process continues, in accordance with an exemplary embodiment, with anisotropic etching of the layer 514 of dielectric material to form spacers 516, as illustrated in FIG. 8. The layer 514 of dielectric material can be etched by, for example, RIE using a suitable etching chemistry. As shown, the resulting spacers 516 are formed such that they are adjacent to the sidewalls of gate structure 508. The arrows in FIG. 8 schematically represent the implantation of ions 518 at a tilted angle relative to the surface of semiconductor material 504, and toward gate structure 204. In particular, ions 518 are directed at an angle toward the source-side spacer 516s. Gate structure 508 and spacers 516 are used as an implantation mask to shadow semiconductor material 504 that is proximate to the drain-side spacer 516d. This facilitates the use of a single ion implantation step to amorphize semiconductor material 504.

Notably, the ions 518 are of an amorphizing species having properties and characteristics that enable it to amorphize semiconductor material 504. In other words, when the ions 518 are implanted into semiconductor material 504, they alter or damage the normally regular and consistent crystalline lattice structure of semiconductor material 504. For this particular embodiment, the species can be xenon (Xe), germanium (Ge), silicon (Si), or the like, which demonstrates an ability to amorphize silicon material in the manner described here.

The use of a tilted ion implantation technique is desirable to change portions of semiconductor material 504 into amorphized regions 520 having the desired shape, dimensions, and profile in semiconductor material 504. In practice, the tilted angle and dosage of the ions 518 are controlled such that amorphized region 520s extends under spacer 516s and toward gate structure 508, as shown in FIG. 8. In practice, the angle of incidence of ions 518, relative to the surface of semiconductor material 504, can be within the range of about 0-40 degrees, but will depend on the depth and width (under the spacer) of amorphization desired. The dosage of ions 518 may be within the range of $10^{13}$ atoms/cm$^2$ to $10^{14}$ atoms/cm$^2$, but will depend on the depth and width (under the spacer) of amorphization desired. The tilted angle promotes amorphizing of semiconductor material 504 under spacer 516s such that the end of amorphized region 520s extends toward the channel region.

The shadowing caused by gate structure 508 and spacers 516, along with the angle of ions 518, causes slight offsetting of amorphized region 520d, relative to spacer 516d. In other words, amorphized region 520d is spaced away from spacer 516d, while amorphized region 520s reaches (and actually extends under) spacer 516s. The creation of such asymmetric amorphized regions 520 in this manner is important, for the reasons discussed below.

Figure 9:
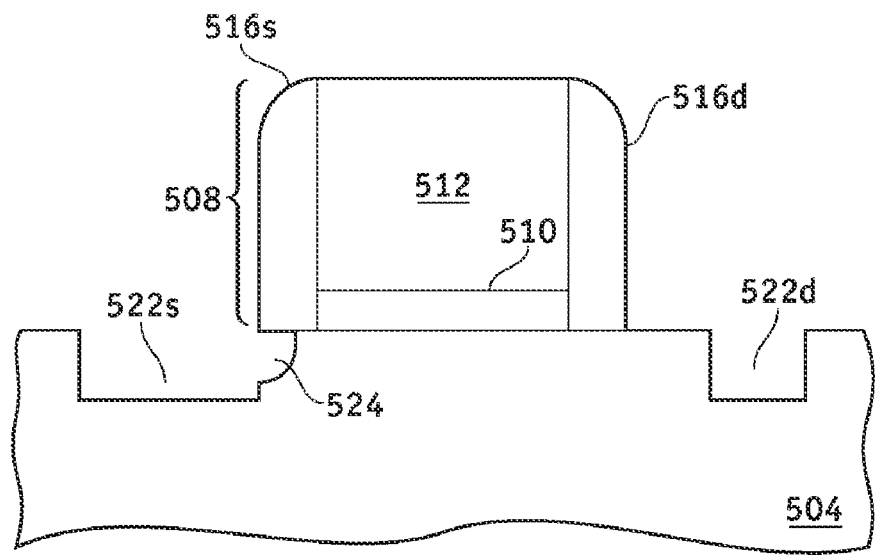
Figure 10:
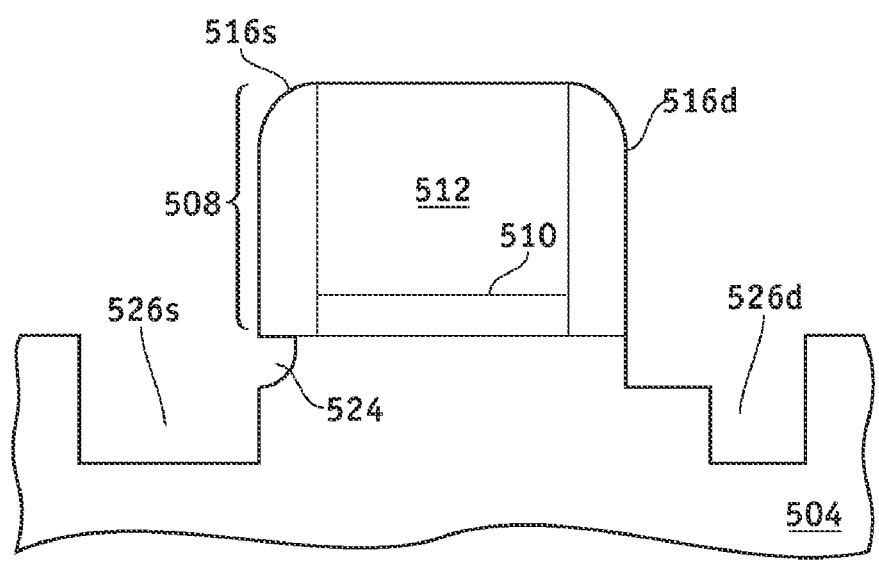

Although other fabrication steps or sub-processes may be performed after the formation of amorphized regions 520 (e.g., a breakthrough etch step to remove native oxide), this example continues with an etching step that selectively removes amorphized regions 520, while leaving the remainder of semiconductor material 504 substantially intact. This etching step results in recesses 522 being formed in semiconductor material 504, as shown in FIG. 9. Notably, the source recess 522s and the drain recess 522d extend asymmetrically toward the channel region. For this embodiment, the process employs an isotropic etch technique to etch away amorphized regions 520. This isotropic etch step may utilize plasma etching with a chlorine based chemistry to achieve the desired shallow recess profile. As a result of this etch, source recess 522s includes a pocket 524 under spacer 516s, and at least a portion of spacer 516s overhangs pocket 524 (see FIG. 9).

Although other fabrication steps or sub-processes may be performed after the formation of recesses 522, this example continues by increasing the depth of recesses 522. In accordance with the illustrated embodiment, selected portions of the semiconductor material 504 are further etched to increase the depth of recesses 522. In this regard, a breakthrough etch may be followed by an anisotropic etch using, for example, a CF$_4$ based chemistry. Thus, semiconductor material 504 is directionally etched, using gate structure 508 and spacers 516 as a self-aligned etch mask, to deepen and extend recesses 522 (see FIG. 10). This etching step is controlled to form stepped recesses 526 in semiconductor material 504, where stepped recesses 526 have the desired overall depth. Stepped recess 526d (on the drain side) is created by extending the depth of recess 522d while also etching down the "shelf" portion between spacer 516d and the edge of recess 522d (see FIG. 9).

Notably, stepped recesses 526 are formed without any photolithography or etching steps related to the formation of additional spacers.

Figure 11:
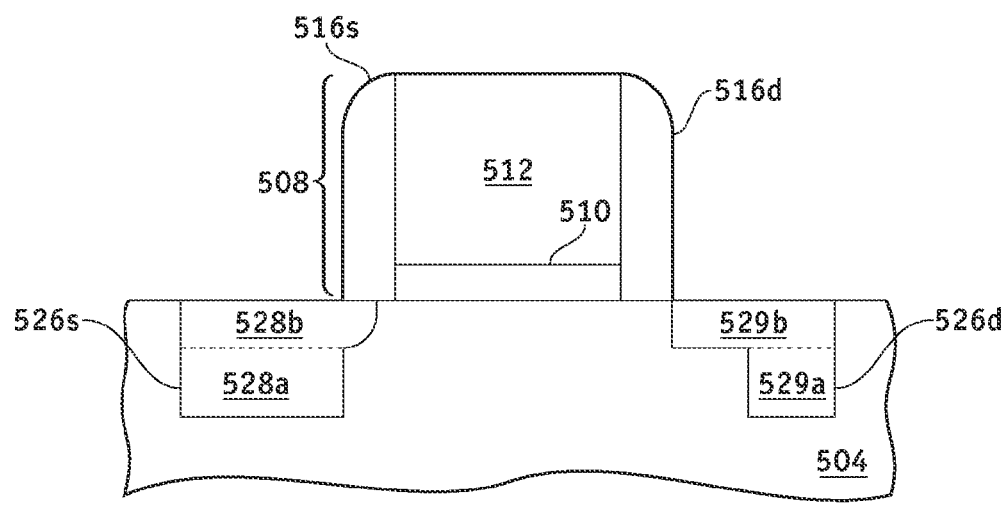

Although other fabrication steps or sub-processes may be performed after the formation of stepped recesses 526, this example continues by at least partially filling stepped recesses 526 with a stress-inducing semiconductor material, preferably a doped silicon based material. FIG. 11 shows stepped recess 526 after they have been filled with stress-inducing semiconductor material. In this embodiment, the stress inducing semiconductor material is formed by selectively epitaxially growing an in situ doped silicon material in stepped recesses 526. As used here, "in situ doped" means that a suitable dopant is introduced into a host material as that host material is grown. Epitaxially grown in situ doped silicon material is utilized here such that the material need not be subjected to ion implantation for purposes of doping. As mentioned previously, for an NMOS transistor device, the in situ doped semiconductor material may be phosphorus doped silicon carbon, and for a PMOS transistor device, the in situ doped semiconductor material may be boron doped silicon germanium.

In FIG. 11, stress-inducing semiconductor material 528 represents the source region, while stress-inducing semiconductor material 529 represents the drain region. The embodiment depicted in FIG. 11 employs a non-uniform doping profile for the stress-inducing semiconductor material 528/529. For example, the deeper regions of the stress-inducing semiconductor material (identified by reference numbers 528a and 529a) may have relatively high doping, while the shallower regions of the stress-inducing semiconductor material (identified by reference numbers 528b and 529b) may have relatively low doping. Such non-uniform doping can be controlled and achieved while the material is being epitaxially grown.

Figure 12:
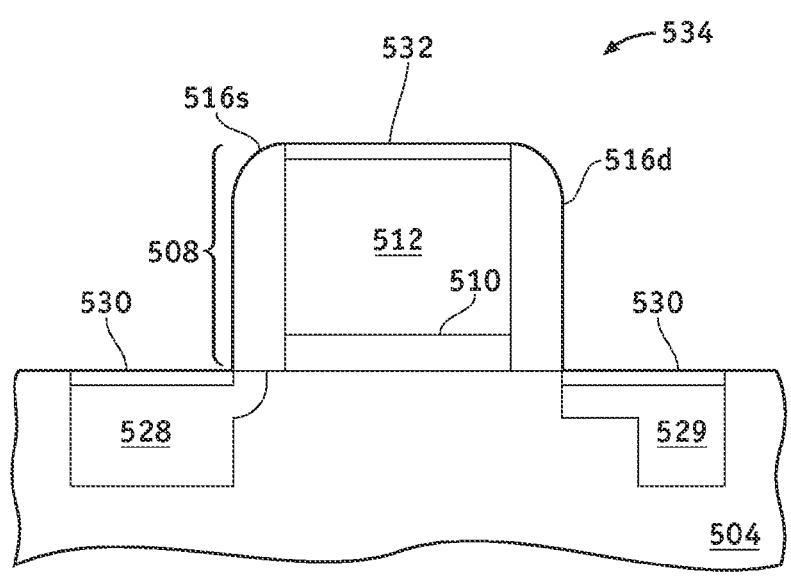

Although other fabrication steps or sub-processes may be performed at this time (e.g., thermal annealing, formation of additional spacers, etc.), this example continues by forming metal silicide contact areas 530 on the stress-inducing semiconductor material 528/529. In addition, a metal silicide contact area 532 may be formed on polycrystalline silicon gate electrode 512, as depicted in FIG. 12. It should be apparent that FIG. 12 depicts a device structure 534 after a number of known process steps have been performed. For the sake of brevity, these intermediate steps will not be described in detail. In practice, an appropriate silicidation process is performed to create metal silicide contact areas 530 and 532. For example, a layer of silicide-forming metal (not shown) is deposited onto the surfaces of stress-inducing semiconductor material 528/529 and onto the surface of gate electrode 512. The silicide-forming metal can be deposited, for example, by sputtering to a thickness of about 5-50 nm and preferably to a thickness of about 10 nm. The wafer is then heated, for example by rapid thermal annealing, to form metal silicide contact areas 530 and 532. The silicide-forming metal can be, for example, cobalt, nickel, rhenium, ruthenium, or palladium, or alloys thereof. Any silicide-forming metal that is not in contact with exposed silicon does not react during heating and, therefore, does not form a silicide. This excess metal may be removed by wet etching or any suitable procedure.

Thereafter, any number of known process steps can be performed to complete the fabrication of the MOS transistor device. For the sake of brevity, these process steps and the resulting MOS transistor device are not shown or described here. A MOS transistor device can be manufactured in this manner such that it has stepped recesses for strain elements, without having to carry out the additional process steps associated with the conventional process.

Referring back to FIG. 4, the stepped profile of stress-inducing semiconductor material 408 (on the drain side) can be created using tilted ion implantation directed toward the drain side of gate structure 508, similar to that described above with reference to FIG. 8. However, the tilted angle and dosage of the ions will be selected such that the amorphized source-side region and the amorphized drain-side region are asymmetric. In other words, the amorphized source-side region will extend further toward the channel region than the amorphized drain-side region. Ultimately, the asymmetric amorphized regions will facilitate the creation of the asymmetric stress-inducing regions as depicted in FIG. 4.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor transistor device comprising:
a layer of semiconductor material having a channel region defined therein;
a gate structure overlying the channel region, the gate structure including a source sidewall and a drain sidewall;
a first spacer formed on the source sidewall;
a second spacer formed on the drain sidewall;
recesses formed in the layer of semiconductor material and adjacent to the channel region, the recesses extending asymmetrically toward the channel region; and
stress-inducing semiconductor material formed in the recesses; wherein:
the recesses include a source recess and a drain recess;
the source recess is a stepped recess having an upper portion that extends to form a pocket under the first spacer, and having a lower portion that is self-aligned with the first spacer; and
the drain recess is a stepped recess having an upper portion that is self-aligned with the second spacer.

2. The semiconductor transistor device of claim 1, wherein:
the source recess extends further toward the channel region than the drain recess; and
the stress-inducing semiconductor material in the source recess extends further toward the channel region than the stress-inducing semiconductor material in the drain recess.

3. The semiconductor transistor device of claim 1, wherein the stress-inducing semiconductor material comprises epitaxially grown, in situ doped, semiconductor material.

4. The semiconductor transistor device of claim 3, wherein:
the semiconductor transistor device is an NMOS transistor device; and
the in situ doped silicon material is silicon carbon.

5. The semiconductor transistor device of claim 3, wherein:
the semiconductor transistor device is a PMOS transistor device; and
the in situ doped silicon material is silicon germanium.

6. A semiconductor transistor device comprising:
a layer of semiconductor material;
a gate structure overlying the layer of semiconductor material, the gate structure comprising a source sidewall and a drain sidewall;
a first spacer formed on the source sidewall;
a second spacer formed on the drain sidewall;
a source region in the layer of semiconductor material, the source region comprising a stress-inducing semiconductor material with a stepped profile having an upper portion that extends under the first spacer, and having a lower portion that is self-aligned with the first spacer; and
a drain region in the layer of semiconductor material, the drain region comprising the stress-inducing semiconductor material with a stepped profile having an upper portion that is self-aligned with the second spacer; wherein
the minimum distance between the stress-inducing semiconductor material of the source region and a projection of the source sidewall into the layer of semiconductor material is less than the minimum distance between the stress-inducing semiconductor material of the drain region and a projection of the drain sidewall into the layer of semiconductor material.

7. The semiconductor transistor device of claim 6, wherein the stress-inducing semiconductor material comprises epitaxially grown, in situ doped, semiconductor material.

8. The semiconductor transistor device of claim 7, wherein:
the semiconductor transistor device is an NMOS transistor device; and
the in situ doped silicon material is silicon carbon.

9. The semiconductor transistor device of claim 7, wherein:
the semiconductor transistor device is a PMOS transistor device; and
the in situ doped silicon material is silicon germanium.

* * * * *